(12) United States Patent
Iwasaki et al.

(10) Patent No.: US 6,403,894 B1
(45) Date of Patent: Jun. 11, 2002

(54) PRINTED WIRING BOARD WITH INSECT REPELLANT

(75) Inventors: Kazumi Iwasaki, Nara; Toshikazu Tomioka, Ibaraki, both of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/316,016

(22) Filed: May 21, 1999

(30) Foreign Application Priority Data

May 26, 1998 (JP) .............................. 10-143893

(51) Int. Cl.$^7$ ................................ H05K 1/03
(52) U.S. Cl. .................. 174/256; 174/261; 174/260
(58) Field of Search .................. 174/250, 260, 174/261, 256, 257

(56) References Cited

U.S. PATENT DOCUMENTS

| | | | |
|---|---|---|---|
| 5,726,750 A | 3/1998 | Ito et al. | .................. 356/244 |
| 6,144,522 A | * 11/2000 | Myokan | |

FOREIGN PATENT DOCUMENTS

| | | |
|---|---|---|
| EP | 0 856 556 | 8/1998 |
| EP | 0 953 611 | 11/1999 |
| JP | 2-20094 | 1/1990 |
| JP | 04-104041 A | 4/1992 |
| JP | 06-213804 A | 8/1994 |
| JP | 07-063616 A | 3/1995 |

OTHER PUBLICATIONS

Patent Abstracts of Japan; Pub. No. 06–213804; Pub. Date: Aug. 5, 1994.
Patent Abstracts of Japan; Pub. No. 07–063616; Pub. Date: Mar. 10, 1995.
Patent Abstracts of Japan; Pub. No. 04–104041; Pub. Date: Apr. 6, 1992.

\* cited by examiner

*Primary Examiner*—Kamand Cuneo
(74) *Attorney, Agent, or Firm*—Parkhust & Wendel, L.L.P.

(57) ABSTRACT

A printed wiring board to suppresses invasion and occupation of insects having sensory nerves such as cockroaches and ants. Accordingly, it prevents malfunctioning of electronic appliances due to the presence of insects. It further avoids thickness fluctuation or blurring of the repellent layer of electronic material containing the repellent chemical. These printed wiring boards are warp-free and appear normal. A printed wiring board of the invention contains an electronic material formed on at least one of first and second surfaces of an insulating substrate. The electronic material contains a neurologically active insect and a binder. The electronic material forms a selective pattern.

41 Claims, 8 Drawing Sheets

PRINTED WIRING BOARD WITH INSECT REPELLANT

FIELD OF THE INVENTION

The present invention relates to printed wiring boards for use in general electronic appliances in the home or office.

BACKGROUND OF THE INVENTION

Previously, environments excessively inhabited by insects were not appreciated, and no measures were taken against the invasion or nesting of insects in electronic appliances. Without any particular internal measures against insects, only the shape of housing of the electronic appliances was designed to prevent invasion, and further measures to rid the entire external environments were considered.

However, the downsizing of electronic appliances, diversified needs for saving energy, increases in the number of electronic household appliances (rice cooker, refrigerator, microwave oven, etc.), and growth of dining industry, has created a mounting demand for reliable electronic appliances for professional kitchens, restaurants and others (air conditioner, security system, electronic cooking apparatus, business telephone, etc.). Hence, insect countermeasures are required inside the electronic appliances.

Presently, electronic materials containing repellents, are manufactured by mixing repellent directly into the resin. However, the manufacturing method of electronic materials containing repellents requires mixing large amounts of repellent in the resin, and blurring was likely to occur when applying or forming. Furthermore, there are problems in stability of quality. Moreover, the conventional manufacturing method of electronic materials containing repellents requires higher ultraviolet exposure, greater temperatures, and longer time, by 50 to 100%, as compared with other general ultraviolet curing solder resist, thermosetting solder resist, or parts layout. Consequently, the repellent effect was lowered during the curing process.

Moreover, in order to apply and form the electronic materials containing repellents in the entire region except for the soldering lands or the like, it is difficult to establish the manufacturing conditions such as printing conditions (plate gap, printing speed, etc.) and curing condition (curing method, temperature, time, etc.). Accordingly, the repellent effect and quality were unstable. When the electronic materials containing repellents are applied and formed in the entire region except for the soldering lands or the like, fluctuations of thickness of the formed film and warping of printed wiring board are likely to occur. As a result, when mounting parts on the surface, defective printing of solder paste, defective standing of chips, and deviation of position of mounted parts were experienced.

In the conventional electronic materials containing repellents, since it was necessary to mix a large amount of repellents in the resin, blurring was likely to occur when the electronic materials were applied and formed, and it was difficult to assure the quality. Moreover, since the higher ultraviolet exposure and temperature and longer time by 50 to 100% than usual were needed, the repellents disappeared gradually, and the repellent effect was lowered. Besides, as the electronic materials containing repellents were applied and formed in the entire region except for the soldering lands or the like, the plate gap increased, the printing speed dropped, and the printing conditions were worsened. As a result, blurring and deviation occur and the quality is unstable. Moreover, due to worsening of curing conditions such as higher temperature and longer time, the repellents are gradually lost and the repellent effect is lowered.

Still worse, as the electronic materials containing repellents are applied and formed in the entire region except for the soldering lands or the like, fluctuations of thickness of the formed film and warping of printed wiring board are likely to occur. As a result, when mounting small-sized parts on the printed board, defective printing of solder paste, defective standing of chips, and deviation of position of mounted parts are likely to occur.

Hence it is an object of the invention to improve the quality of printed wiring board (deviation in thickness, blurring, warping, etc.), enhance the repellent effect efficiently, and maintain stability, while presenting a printed wiring board with insect countermeasures and its manufacturing method capable of decreasing warp and other defects in the mounting process of components.

SUMMARY OF THE INVENTION

A printed wiring board of the invention comprises:

an insulating substrate having first and second surfaces, conductive and insulting layers on at least one of the first and second surfaces, and an electronic material formed on at least one of the first surface and second surface of the insulating substrate having the conductive layer and insulating layer, in which the electronic material contains a repellent having an insect repelling performance and a binder, and the electronic material is formed with a selective pattern.

A manufacturing method of a printed wiring board of the invention comprises:

(a) a step of placing a conductive layer in at least one of a first surface and a second surface of an insulating substrate, (b) a step of placing an insulating layer so as to cover the conductive layer, and (c) a step of forming an electronic material containing a repellent having an insect repelling performance and a binder, on at least one of the first surface and the_@ second surface, with a selective pattern.

This constitution suppresses invasion and occupation of insects having sensory nerves such as cockroaches and ants in the printed wiring board. It prevents troubles of electronic appliances due to dead bodies or wastes of these insects. As a result, the reliability of electronic appliances is enhanced. It further prevents thickness fluctuation or blurring of the repellent layer of the electronic material mixing the repellent. The printed wiring board of the invention is free from warp or other abnormal appearance. By using the printed wiring board of the invention, occurrence of defects is decreased in the process of mounting the parts. Further, the productivity is enhanced. The printing wiring board having all these effects is obtained. Thus, without sacrificing the repellent effect, the productivity is enhanced, the quality is improved, and the cost is reduced.

REFERENCE NUMERALS

Figure 1A:
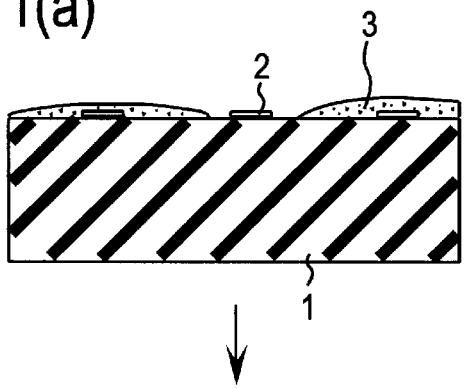
FIG. 1 is a sectional view of essential parts showing an embodiment of a manufacturing process of printed wiring board of the invention.

1 Insulating layer (base material)
2 Conductive layer
3 Thermosetting solder resist
4 Thermosetting parts layout
5 Electronic material with 35 wt. % content of thermosetting repellent (first electronic material)
6 Electronic material with 25 wt. % content of thermosetting repellent (second electronic material)
7 Electronic material with 20 wt. % content of thermosetting repellent (third electronic material)
8 Electronic material with 30 wt. % content of thermosetting repellent (fourth electronic material)
9 Ultraviolet curing solder resist on solder side
10 Ultraviolet curing parts layout on solder side
11 Electronic material with ultraviolet curing repellent on solder side (fifth electronic material)
12 Ultraviolet curing solder resist on component side
13 Ultraviolet curing parts layout on component side
14 Electronic material with ultraviolet curing repellent on component side (sixth electronic material)

DETAILED DESCRIPTION OF THE INVENTION

A printed wiring board in an embodiment of the invention comprises an insulating substrate, a conductive layer and an insulting layer formed on the insulating substrate. An electronic or repelling material as a paint containing a repellent is placed on the insulating substrate having the conductive layer and insulating layer. The electronic material is applied and formed selectively. In this constitution, the repellent effect is exhibited efficiently, and the repellent effect maintained, to obtain a stable repellent effect. Moreover, thickness fluctuations are decreased and blurring is decreased in the electronic material containing the repellent, and moreover warp of the printed wiring board decreases. Thus, enhancing the quality of the printed wiring board.

Preferably, the printed wiring board of the invention has the following constitution.

The printed wiring board has a parts layout, and the electronic material containing the repellent is placed on the printed wiring board having the parts layout. In this constitution, loss of the repellent due to heat in the curing process of the parts layout is prevented, and the above effects are particularly exhibited.

The printed wiring board comprises an electronic material containing a repellent, and a parts layout placed in the printed wiring board having such electronic material. In this constitution, the discernibility of the parts layout is enhanced.

The electronic material containing the repellent is disposed in a wider area on the surface of the printed wiring board on the side for mounting parts, as compared to the side for not mounting parts. By nature, insects prefer narrower, darker place, and warmer places. Insects are likely to prefer invade or nest in such component side. By increasing the forming area of the electronic component containing the repellent on the component side, the repellent effect may be efficiently enhanced.

Preferably, the ratio of the area of electronic material on the component side to the area of electronic material on the solder side is 100 to about 30 to about 90. Hence, the coverage on the solder side is about 10–70% the coverage on the component side. In this constitution, the effects are further enhanced.

In the printed wiring board having the surface side and back side, the concentration of the repellent in the electronic material is changed between the surface side and back side depending on the mounting method, configuration of parts or types of parts. In this constitution, the repellent effect may be efficiently enhanced.

The concentration of the repellent in the electronic material is higher on the solder side. In this constitution, the repellent is gradually lost due to heat of soldering, but if the repellent is decreased, lowering of the repellent effect may be prevented.

In the printing circuit board of both-side mounting type, the concentration of the repellent in the electronic material is higher on the side mounting more heat generating parts such as semiconductors. In this constitution, invasion and nesting of insects preferring the warmer place can be efficiently prevented.

Preferably, the ratio of the concentration of the repellent in the electronic material on the solder side to the opposite side is 100 to about 30 to about 80. In this constitution, although the repellent is gradually lost by the heat of soldering, since the concentration of the repellent in the electronic material on the solder flow side is higher, lowering of the repellent effect is prevented.

Preferably, the ratio of the concentration of the repellent in the electronic material on the side mounting more heat generating parts to the opposite side is 100 to about 50 to about 80. In this constitution, invasion and nesting of insects preferring the warmer place can be efficiently prevented.

Near the heat generating parts such as semiconductors likely to be inhabited by the insects preferring the warmer place, the electronic material containing the repellent is applied and formed. In this constitution, the repellent effect may be efficiently enhanced.

Near the heat generating parts such as semiconductors likely to be inhabited by the insects preferring warmth, the electronic material containing a higher concentration of the repellent is applied and formed. In this constitution, the repellent effect may be efficiently enhanced.

Around the heat generating parts such as semiconductors likely to be inhabited by the insects preferring warmth, the electronic material containing the repellent is applied in a concentric pattern. In this constitution, the repellent effect may be enhanced.

Preferably, around the heat generating parts such as semiconductors likely to be inhabited by the insects preferring warmer places, the electronic material containing the repellent is applied and formed in a concentric pattern, and the density of the concentric pattern is higher in the positions closer to the heat generating parts. In this constitution, the repellent effect may be efficiently enhanced.

The concentration of the repellent in the electronic material is higher in the position closer to the heat generating parts such as semiconductors likely to be inhabited by the insects preferring the warmer place. In this constitution, the repellent effect may be efficiently enhanced.

In order to prevent mounting deviation of surface mount parts such as QFP and chip components, the electronic material containing the repellent is applied and formed in a region excluding immediately beneath the surface mount parts. In this constitution, troubles in parts mounting process are prevented.

To ensure that the antennae and legs of insects contact the electronic material, that thickness fluctuations and blurring of the electronic material decreases, and that warping of printed wiring board also decreases, the electronic material containing the repellent is applied and formed in mesh. In this constitution, a small concentration of repellent exhibits effective insect repulsion, and decrease the total loss of the repellent. As a result, the quality improves, productivity is enhanced, and the cost reduced. Moreover, defects in the mounting process of the user are decreased.

To ensure the antennae and legs of insects contact the electronic material, and that thickness fluctuation and blurring of the electronic material decreases, the electronic material containing the repellent is applied and formed in stripes depending on the mounting position and mounting state of parts. In this constitution, a small concentration of repellent exhibits effective insect repulsion, the quality and productivity are enhanced, and defects in the mounting process of parts are decreased.

Depending on the density of the mounted parts and the mounting form, the electronic material containing the repellent is applied and formed in dots. In this constitution, a small concentration of repellent exhibits effective insect repulsion, the quality and productivity are enhanced, and defects in the mounting process of parts are decreased. Moreover, the consumption of the electronic material containing the repellent is saved, thereby reducing costs.

To avoid invasion and nesting of insects in the center of the substrate, the electronic material containing the repellent is applied in a concentric pattern from the center of the substrate. In this constitution, the repellent effect may be efficiently enhanced.

The electronic material containing the repellent is applied and forms in a film around the end of the substrate. In this constitution, invasion of insects onto the substrate is prevented, so that the repellent effect may be efficiently enhanced.

The concentration of the repellent in the electronic material is higher in the periphery of the substrate. In this constitution, invasion of insects onto the substrate is prevented, so that the repellent effect may be efficiently enhanced.

To minimize the thickness fluctuations of the film shape and blurring of the electronic material containing the repellent, the electronic material is formed in a circular dot form. In this constitution, the antennae and legs of insects may contact securely with the electronic material. At a small concentration of repellent, the repellent exhibits effective insect repulsion, warp of the printed wiring board decreases, the quality and productivity are enhanced, and defects in the parts mounting process decrease. Further, the consumption of the electronic material containing the repellent is decreased, thereby reducing costs.

The film pitch of the electronic material containing the repellent is formed at about 1 to about 20 mm depending on the size of the insects to be repelled. In this constitution, the antennae and legs of insects may contact securely with the electronic material. As a result, the repellent effect may be efficiently enhanced.

The film density of the electronic material containing the repellent is higher in the periphery of the substrate. In this constitution, invasion of insects onto the substrate is prevented, and the repellent effect may be efficiently enhanced.

A manufacturing method of a printed wiring board of the invention comprises (a) a step of forming a conductive layer and an insulating layer in at least one side of an insulating substrate, (b) a step of applying an electronic material as a paint containing a repellent selectively on an insulating substrate having the conductive layer and insulating layer, and (c) a step of curing the electronic material. In this constitution, thickness fluctuation and blurring of the electronic material containing the repellent are prevented. Further, warp of the printed wiring board is decreased. Thus, the quality and productivity are enhanced. Further, the consumption of the electronic material containing the repellent is decreased, so that the cost is reduced. Moreover, defects in the parts mounting process are decreased.

It preferably comprises the following step.

In the step of selectively applying and curing the electronic material containing the repellent, in the constitution in which the soldering side is a first surface of the electronic material, it is intended to prevent slight deterioration of the repellent effect due to loss of the repellent due to heat in the curing step. Further, the repellent effect is exhibited effectively.

The manufacturing condition in the step of selectively applying the electronic material containing the repellent and the step of curing, on the printed wiring board having a surface side and a back side, has different manufacturing conditions on the surface side and back side. In this constitution, the loss of the repellent is decreased, and the repellent effect is exhibited effectively. The repellent effect is further enhanced. Moreover, thickness fluctuation and blurring of the electronic material containing the repellent are decreased. Further, warp of the printed wiring board is decreased. Thus, the quality and productivity are enhanced, and defects decreased in the parts mounting process.

In the step of curing the electronic material containing the repellent, first by provisionally curing one side, the loss of the repellent is suppressed, and then the other side is heated. In this constitution, loss of the repellent due to heat in the curing process is prevented, and deterioration of the repellent effect is prevented. As a result, the repellent effect is enhanced by decrease of loss of the repellent.

In the step of curing the electronic material, the electronic material is cured provisionally, and then the parts layout is applied, and this parts layout is subsequently used in the curing step and the electronic material is cured completely. In this constitution, it is effective to prevent loss of the repellent due to heat in the curing step of the parts layout, and prevent deterioration of the repellent effect. As a result, the loss of the repellent is decreased, and the repellent effect is exhibited effectively. Further, warp of the printed wiring board is decreased. Thus, the quality and productivity are enhanced.

Before the step of selectively applying the electronic material containing the repellent and the step of curing, a step of plating a noble metal is provided. In this constitution, the loss of the repellent due to the plating step is prevented.

Before the step of selectively applying the electronic material containing the repellent and the step of curing, a step of applying a conductive paste and a step of curing the conductive paste are provided. In this constitution, the loss of the repellent due to forming of the conductive paste is prevented.

In the step of curing the electronic material containing the repellent, first by provisionally curing the first surface by heat of about 50 to 90%, the loss of the repellent is suppressed, and then the second surface is heated. In this constitution, by decrease of the loss of the repellent, the repellent effect is exhibited effectively. Moreover, warp of the printed wiring board is decreased. Thus, the quality and productivity are enhanced.

In the step of curing the electronic material containing the repellent on the first surface, the electronic material is first cured provisionally by heat of 40 to 80% of the ordinary heat, and then the heat is applied for forming the parts layout and conductive paste. In this constitution, the loss of the repellent by the previous heat is decreased, and further the loss of the repellent by the heat applied for forming the parts layout and conductive paste is suppressed. As a result, the repellent effect is enhanced.

In the step of curing the electronic material containing the repellent on both face surface and back surface and then forming the parts layout, the electronic material on the face surface and back surface is cured provisionally by heat of about 40 to about 80% of the ordinary heat, and then the heat is applied for forming the parts layout. In this constitution, the loss of the repellent by the heat in the curing step is suppressed. As a result, the repellent effect is enhanced.

A parts layout is formed on a first surface, and then an electronic material containing a repellent is formed. A parts layout is applied on other second surface, and this parts layout is provisionally cured by heat of about 60 to 95% of the ordinary heat, and then the electronic material containing the repellent is formed. In this constitution, the loss of the repellent contained in the electronic material on the first surface is suppressed. As a result, the repellent effect is exhibited effectively. Moreover, warp of the printed wiring board is decreased. Thus, the quality and productivity are enhanced.

A parts layout is applied on a first surface, and this parts layout is provisionally cured by heat of about 50 to about 85% of the ordinary heat, then an electronic material containing a repellent is formed. On other second surface, a solder resist is applied, and this solder resist is provisionally cured by heat of about 70 to about 95% of the ordinary heat, and a parts layout is applied, and this parts layout is provisionally cured by heat of about 60% to about 95% of the ordinary heat. In this constitution, the heat when forming the solder resist and parts layout on the face surface and back surface can be lowered. Therefore, the loss of the repellent in this process is decreased. As a result, the repellent effect is exhibited effectively. Moreover, warp of the printed wiring board is decreased. Thus, the quality and productivity are enhanced.

Preferably, in the step of curing the electronic material containing the repellent, a solder resist is applied on the first surface, and this solder resist is provisionally cured by heat of about 60 to about 85% of the ordinary heat, and then the electronic material is formed. In this constitution, the heat when forming the solder resist can be lowered and the loss of the repellent is further suppressed. As a result, the repellent effect is exhibited effectively. Moreover, warp of the printed wiring board is decreased. Thus, the quality and productivity are enhanced.

An electronic material containing a repellent is formed on a first surface, and then a parts layout is applied, and this parts layout is provisionally cured by heat of about 50 to about 85% of the ordinary heat. An electronic material containing a repellent is formed on other second surface and then a parts layout is formed. In this constitution, the heat when forming the parts layout on the first surface can be lowered, and it is less vulnerable to the effect of heat of the second surface. Therefore, the loss of the repellent is suppressed, and the repellent effect is exhibited effectively. Moreover, warp of the printed wiring board is decreased. Thus, the quality and productivity are enhanced.

An electronic material of thermosetting type containing a repellent on face surface and back surface is cured, and then a parts layout of ultraviolet curing type is formed. Or, on face surface and back surface, an electronic material of ultraviolet curing type containing a repellent is cured, and then a parts layout of thermosetting type is formed. The electronic material and the parts layout have mutually different curing steps. In this constitution, warp of the printed wiring board is decreased. As a result, the quality and productivity are enhanced.

In the step of curing the electronic material containing the repellent, the electronic component containing the repellent is cured by ultraviolet rays. In this constitution, the productivity is enhanced. Further, the first surface is provisionally cured by the integrated quantity of light of about 55 to about 95% of the ordinary quantity of light. In this constitution, the loss of the repellent is suppressed, and the repellent effect is exhibited effectively.

An electronic material containing a repellent is formed on a first surface, and then a parts layout is applied, and this parts layout is provisionally cured by heat of about 50 to about 85%. A solder resist is applied on other second surface and this solder resist is provisionally cured by heat of 70 to 95%. Then, the electronic material containing the repellent is formed, and then the parts layout is formed. When forming the electronic material, solder resist and parts layout, after completely forming the first surface, the second surface is formed, and further when forming the parts layout on the second surface, the electronic material, solder resist of the first surface and the electronic material on the second surface are fully cured. In this constitution, the productivity is enhanced, the cost is reduced, and the loss of the repellent is suppressed. As a result, the repellent effect is exhibited effectively.

Preferably, in the step of curing the electronic material containing the repellent, a solder resist is applied on the first surface, and this solder resist is provisionally cured by heat of about 60 to about 85% of the ordinary heat, and then the electronic material containing the repellent is formed. In this constitution, the above effects are exhibited more excessively.

The electronic material containing the repellent on the first surface is provisionally cured by the ultraviolet ray in the integrated quantity of light of about 45 to about 85%. In this constitution, the loss of the repellent is suppressed, and the repellent effect is exhibited effectively.

The electronic material on the face surface and back surface is provisionally cured by the integrated quantity of light of about 45 to about 85%, and in the subsequent step of forming the parts layout, different curing processes of thermosetting type and ultraviolet curing type are selected. In this constitution, the productivity is enhanced. Further, the loss of the repellent by heat is suppressed. As a result, the repellent effect is exhibited effectively.

A parts layout is formed on a first surface, then an electronic material containing a repellent is applied, and this electronic material is provisionally cured by ultraviolet rays by the integrated quantity of light of about 45 to about 85%. A parts layout is applied on a second surface, and the parts is provisionally cured by the integrated quantity of light of about 65 to about 95%, then an electronic material containing a repellent is formed. In this constitution, effects of heat when forming the parts layout can be avoided, and the loss of the repellent is suppressed. As a result, the repellent effect is exhibited effectively. Moreover, warp of the printed circuit board is decreased. Thus, the quality is enhanced, and the productivity by ultraviolet ray curing is enhanced.

A parts layout is formed on a first surface, and the parts layout is provisionally cured by the integrated quantity of light of 55 to 90%. On a second surface, a solder resist is applied, and the solder resist is provisionally cured by the integrated quantity of light of 75 to 95%, then a parts layout is applied, and the parts layout is provisionally cured by the integrated quantity of light of 65 to 95%. Afterwards, on the second surface, an electronic material containing a repellent is applied, and cured. In this constitution, when curing the parts layout on the face surface and back surface and the solder resist and parts layout on the second surface, the heat effect is suppressed low. Accordingly, the loss of the repellent is suppressed, the repellent effect is exhibited effectively, and warp of the printed wiring board is decreased. Thus, the quality and productivity are enhanced.

Preferably, in the step of curing the electronic material containing the repellent, before forming the electronic material containing the repellent of the first surface, a solder resist is applied, and the solder resist is provisionally cured by the integrated quantity of light of about 65 to about 90%. In this constitution, the heat effect in curing can be suppressed much lower. Accordingly, the loss of the repellent is further prevented. As a result, the repellent effect is exhibited effectively, and warp of the printed wiring board is decreased. Thus, the quality and productivity are enhanced.

An electronic material is formed on a first surface, then a parts layout is applied, and the parts layout is provisionally cured by the integrated quantity of light of about 55 to about 90%. On a second surface, an electronic material is formed and then a parts layout is formed. In this process, at the step of curing the electronic material containing the repellent, the electronic materials on the face surface and back surface are provisionally cured by the integrated quantity of light of about 45 to about 85%. In this process, the loss of the repellent due to the integrated quantity of light in the subsequent curing step is suppressed. Accordingly, the repellent effect is exhibited effectively, and warp of the printed wiring board is decreased. Thus, the quality is improved and the productivity is enhanced.

Preferably, in the step of curing the electronic material containing the repellent, the electronic materials on the face surface and back surface are provisionally cured by the integrated quantity of light of about 45 to about 85%. Before forming the electronic material on the second surface, a solder resist is applied, and is provisionally cured by the integrated quantity of light of about 75 to about 95%. In this constitution, the loss of the repellent due to heat effect when forming the solder resist is suppressed. As a result, the repellent effect is exhibited effectively, and warp of the printed wiring board is decreased. Thus, the quality and productivity are enhanced.

Generally, the antennae and legs of insects having sensory nerves such as cockroaches and ants have a cuticular surface. By making use of difference in the skin structures of insects and humans, stimulation by the neurotransmitter chemical through the skin is given only to insects having particular sensory nerves, and these insects are repelled. The neurotransmitter chemical, unlike the olfactory stimulant, is not required to heighten the vapor pressure of the chemical. Hence, wasteful evaporation or dissipation of the chemical can be suppressed, and the performance lasts for a long period. Moreover, by the learning effect of insects having sensory nerves such as cockroaches and ants, by repeating this repellent action several times, nesting of insects can be prevented.

Generally, since the repellent is mixed in the resin paste as a foreign matter, blurring is likely to occur in the formed electronic material. Moreover, when the electronic material is applied in a majority of the area of the printed wiring board, and the electronic material is cured, the formed repellent film is likely to have thickness fluctuations, blurring or warp due to restrictions in the manufacturing conditions. In this embodiment, however, because the electronic material is applied and formed selectively, such defects are eliminated.

Thus, the constitution of the invention prevents deterioration of reliability due to invasion of insects having sensory nerves such as cockroaches and ants into the electronic appliances. Further, as the electronic material containing the repellent is applied selectively, and the electronic material is cured, loss of the repellent is decreased. As a result, the repellent effectively repels, and the repellent effect is enhanced. It is further effective to decrease thickness fluctuations and blurring of the electronic material containing the repellent. In addition, warping of the printed wiring board is decreased. As a result, quality improves, productivity is enhanced, and costs are reduced. Moreover, defects in the mounting process of the user decrease. Thus, the reliability of the printed wiring board is enhanced.

The process of the embodiment of the invention is described below with reference to the drawings.

In the embodiment, the electronic material is mainly composed of a repellent and a binder. The binder contains resin, solvent, filler, pigment, hardener, catalyst and others properly as required. In a manufacturing method of forming the electronic material on the substrate, a paint containing a repellent and a binder is applied on the substrate. This paint may also contain a solvent, and this solvent is removed by evaporation at the time of curing. The method of application is generally a method of printing. In the definition of the electronic material in the embodiment, the hardened and formed electronic material comprises the repellent and the binder, not containing solvent. The electronic material before curing may contain a solvent.

In the embodiment, the insulating substrate refers to either an insulating layer or an insulating base material.

The parts layout, paste, and solder resist are formed on the insulating substrate by using ordinary materials. For example, these paints are applied on the insulating substrate, and then cured. In the embodiment, the parts layout, paste, and solder resist refer to either the state before curing or the cured state.

Methods of curing the electronic material, parts layout, paste, and solder resist include heating, and ultraviolet or other light irradiation method.

FIG. 1 shows a manufacturing process of one-side copper filled printed wiring board in an embodiment of the invention. FIG. 2(a) and FIG. 2(b) show application patterns of electronic material. In FIG. 1, the electronic materials containing the repellent are formed on the face surface and back surface. The electronic material formed on the face surface and the electronic material formed on the back surface have different repellent concentrations, and different curing processes.

As shown in FIG. 1(a), on a glass epoxy (FR-4) insulating layer (or insulting substrate or insulating base material) 1, a conductive layer 2 is formed as a specified copper foil. A thermosetting solder resist 3 is applied on the conductive layer 2, and cured.

Figure 1B:
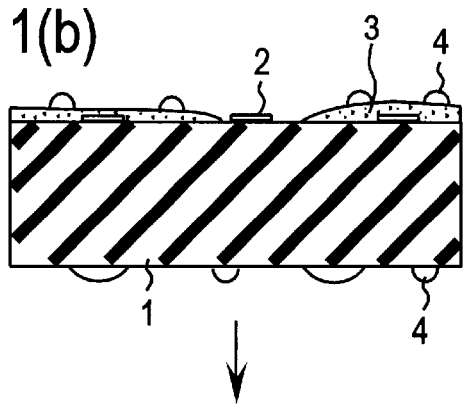

Next, as shown in FIG. 1(b), a thermosetting parts layout 4 is applied on the solder resist 3 having a first surface as a soldering surface, and a thermosetting parts layout 4 on a second surface of the insulating layer 1 for mounting parts. The thermosetting parts layouts 4 applied on both surfaces are cured.

Figure 1C:
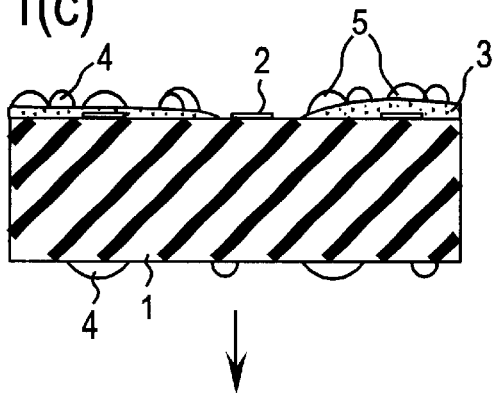

As shown in FIG. 1(c), a first electronic material 5 containing a repellent by concentration of 35 wt. % is applied on the thermosetting solder resist 3 and thermosetting parts layout 4 on the first surface of soldering (solder flow) side, in stripes as shown in FIG. 2(a). The first electronic material 5 is then provisionally cured in a hot stove in the condition of 160° C. and 25 minutes, by heat of about 50 to about 90% of the ordinary curing heat.

Figure 1D:
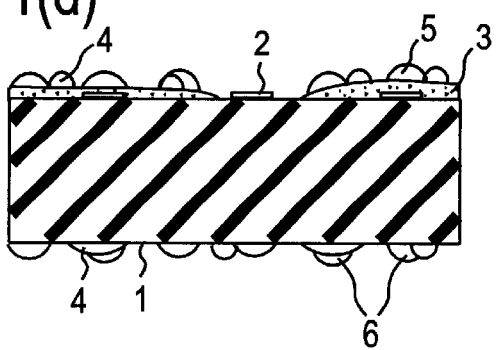

Consequently, as shown in FIG. 1(d), a second electronic material 6 containing a repellent by concentration of 25 wt. % is applied on the thermosetting parts layout 4 formed on the second surface, in mesh as shown in FIG. 2(b). The second electronic material 6 is fully cured in the hot stove in the condition of 160° C. and 35 minutes. At this time, the first electronic material 5 is also cured fully. The second electronic material 6 has the repellent concentration of about 30 to 80% of the first electronic material 5. Thus, the printed wiring board is fabricated. Incidentally, if the conductive paste of carbon, or contact point or terminal of gold or other noble metal plating is required, a step of forming the conductive paste or a step of forming a noble metal plating is added before formation of the first electronic material 5 and second electronic material 6.

FIG. 3 shows a manufacturing process of both-side copper filled printed wiring board in other embodiment of the invention. FIG. 4(a) and FIG. 4(b) show application patterns of electronic material. In FIG. 3, the electronic materials containing different concentrations of the repellent are formed on the face and back surfaces. The electronic material formed on the face surface and the electronic material formed on the back surface are cured in mutually different thermosetting curing processes.

Figure 3A:
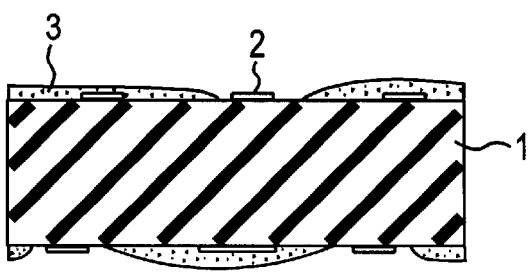
FIG. 3 is a sectional view of essential parts showing another embodiment of a manufacturing process of the printed wiring board of the invention.

As shown in FIG. 3(a), on both sides of a glass epoxy (FR-4) insulating layer (substrate or base material) 1, a conductive layer 2 is formed as a specified copper foil. A thermosetting solder resist 3 is applied to cover the conductive layer 2 except for the soldering area of the solder side and component side, and this thermosetting solder resist 3 is cured.

Figure 3B:
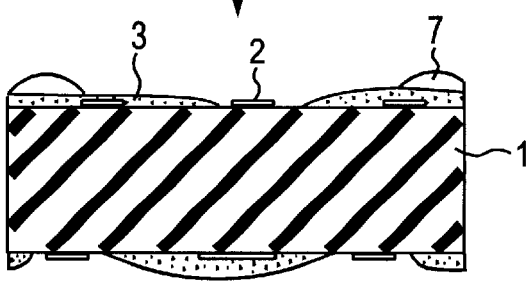

Next, as shown in FIG. 3(b), a third electronic material 7 containing 20 wt. % of repellent is applied on the thermosetting solder resist 3 on a first surface, in a shape as shown in FIG. 4(a), in a band form around the end surface of the substrate. The third electronic material 7 is provisionally cured in a hot stove in the condition of 160° C. and 25 minutes, by about 40% to about 80% of the ordinary curing heat of 160° C. and 35 minutes.

The number of heat generating electronic components mounted on the first surface is smaller than the number of heat generating electronic components mounted on the second surface. Heat generating electronic components are, for example, semiconductors.

Figure 3C:
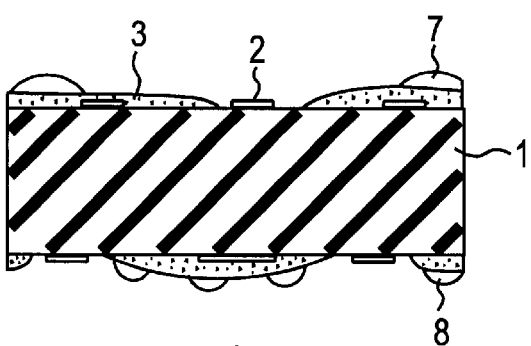

As shown in FIG. 3(c), a fourth electronic material 8 containing 30 wt. % of repellent is applied on the thermosetting solder resist 3 on the second surface, in a concentric pattern from the center of the substrate as shown in FIG. 4(b) so as not to be disposed beneath the mounted parts. The fourth electronic material 8 is then provisionally cured in the hot stove in the condition of 160° C. and 25 minutes, by about 40 to about 80% of the ordinary curing heat of 160° C. and 35 minutes. The content of the repellent contained in the third electronic material 7 is about 50 to about 80% of the content of the repellent contained in the fourth electronic material 8.

Figure 3D:
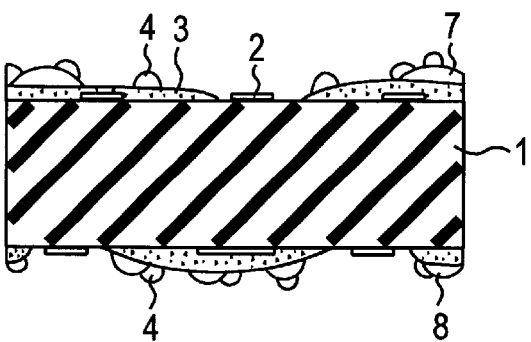

Consequently, as shown in FIG. 3(d), thermosetting parts layouts 4 are applied on the thermosetting solder resist 3 and third electronic material 7 placed on the first surface and the fourth electronic material 8 and solder resist 3 placed on the second surface. The thermosetting parts layouts 4 are cured. Thus, the printed wiring board is fabricated.

In the embodiment, alternatively, the concentration may be decreased gradually from the peripheral area to the center, for example, the concentration of the repellent in the third and fourth electronic materials 7, 8 formed around the substrate is about 30 wt. %, and the concentration of the repellent in the third and fourth electronic materials 7, 8 formed in the center of the substrate is about 15 wt. %. In such constitution, too, the same repellent effects are obtained. It is further possible to compose so that the film density may be lower from the center of the semiconductor or other heat generating electronic component toward the peripheral parts. That is, the film density means the shape of narrowing of interval of concentric lines as approaching the center. In this constitution, the repellent effects are improved. Such concentric patterns may include circle, polygon, quadrangle, or any arbitrary shape.

FIG. 5 shows a manufacturing process of both-side copper filled printed wiring board in a different embodiment of the invention. FIG. 6(a) and FIG. 6(b) show application patterns of electronic material. In FIG. 5, the electronic material on the face surface and the electronic material on the back surface are applied in different areas, and these electronic materials are cured with different ultraviolet curing processes.

Figure 5A:
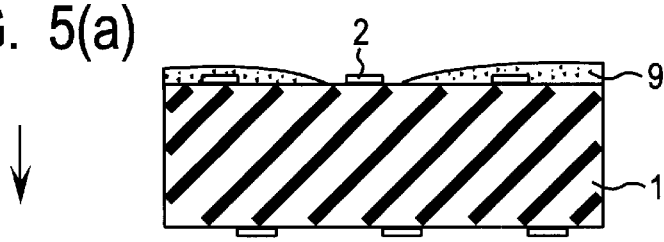
FIG. 5 is a sectional view of essential parts showing a different embodiment of manufacturing process of printed wiring board of the invention.
Figure 6:
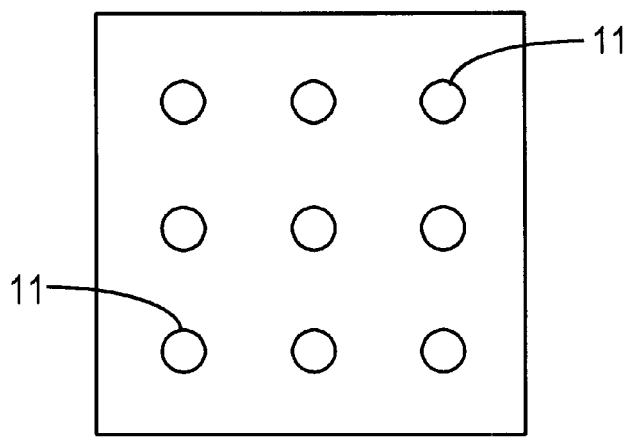
FIG. 6(a) and FIG. 6(b) are explanatory diagrams showing a different application pattern of electronic material used in the printed wiring board of the invention.
Figure 6:
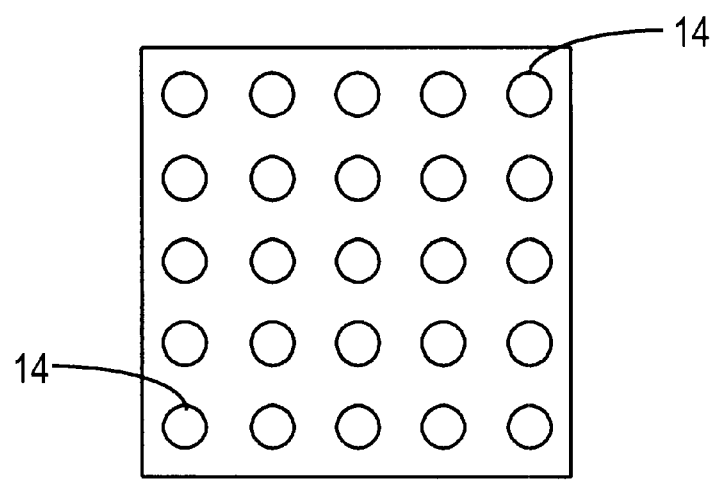

As shown in FIG. 5(a), on a glass epoxy (FR-4) insulating layer (substrate or base material) 1, a conductive layer 2 is formed as a specified copper foil. An ultraviolet curing type solder resist 9 is applied to cover the conductive layer 2 except for the soldering area, and this ultraviolet curing type solder resist 9 is cured provisionally in an ultraviolet curing oven at 800 mJ/cm$^2$, by about 65 to about 90% of the ordinary integrated quantity of light of 1000 mJ/cm$^2$.

Figure 5B:
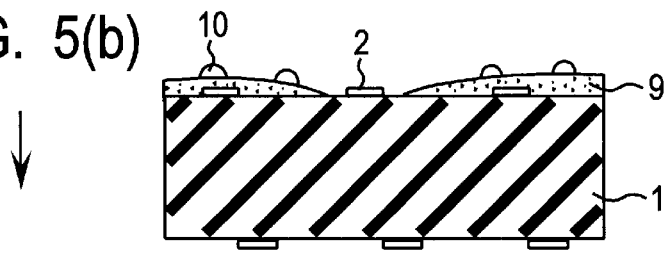

Next, as shown in FIG. 5(b), an ultraviolet curing type parts layout 10 is applied on the ultraviolet curing type solder resist 9, and this ultraviolet curing type parts layout 10 is cured provisionally in the ultraviolet curing oven at 800 mJ/cm$^2$, by about 55 to about 90% of the ordinary integrated quantity of light of 1000 mJ/cm$^2$.

Figure 5C:
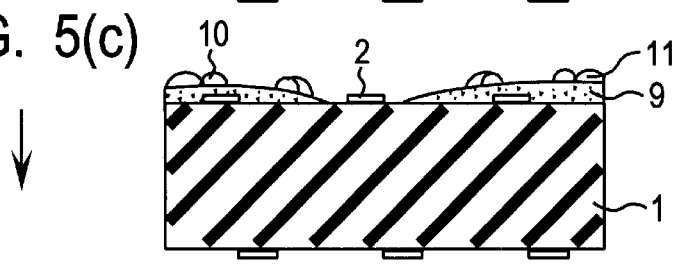

As shown in FIG. 5(c), a fifth electronic material 11 containing a repellent is applied on the ultraviolet curing type solder resist 9 and the ultraviolet curing type parts layout 10 having a first surface as a soldering surface, in dots of 1 mm in diameter at pitches of 4 mm, in about 30 to about 90% of the application area as shown in FIG. 6(a). The fifth electronic material 11 is cured provisionally in the ultraviolet curing oven at 1000 mJ/cm$^2$, by about 45 to about 85% of the curing heat of the second surface.

Figure 5D:
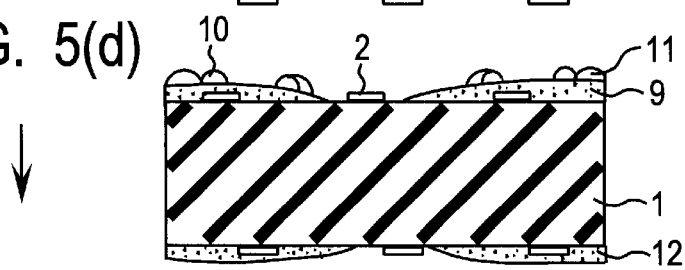

As shown in FIG. 5(d), covering the conductive layer 2 except for the soldering area of the second surface, an ultraviolet curing type solder resist 12 is applied, and this ultraviolet curing type solder resist 12 is cured provisionally in the ultraviolet curing oven at 900 mJ/cm$^2$, by about 75 to about 95% of the ordinary integrated quantity of light of 1000 mJ/cm$^2$.

Figure 5E:
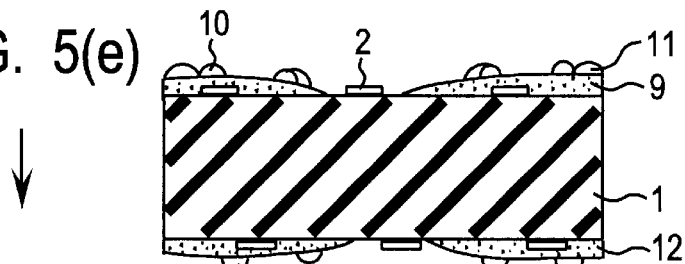

As shown in FIG. 5(e), an ultraviolet curing type parts layout 13 is applied on the ultraviolet curing type solder resist 12 on the second surface, and this ultraviolet curing type parts layout 13 is cured provisionally in the ultraviolet curing oven at 900 mJ/cm$^2$, by about 65 to about 95% of the ordinary integrated quantity of light of 1000 mJ/cm$^2$.

Figure 5F:
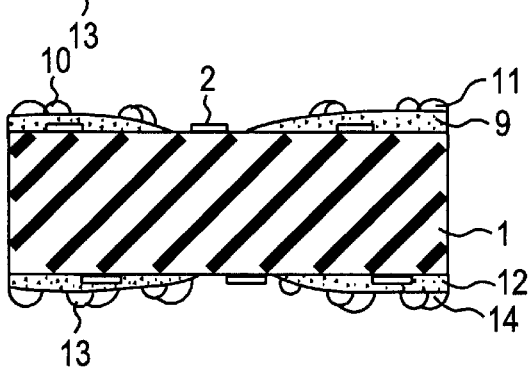

Finally, as shown in FIG. 5(f), a sixth electronic material 14 containing a repellent is applied on the ultraviolet curing type solder resist 12 and the ultraviolet curing type parts layout 13 on the second surface, in dots of 1 mm in diameter at pitches of 2 mm as shown in FIG. 6(b), and this sixth electronic material 14 is cured fully in the ultraviolet curing oven at 1500 mJ/cm$^2$. At the same time, the solder resist 9, parts layout 10, fifth electronic material 11, solder resist 12, and parts layout 13 are fully cured. Thus, the printed wiring board is fabricated.

In this embodiment, from the center of the location of heat generating parts such as semiconductors, the electronic material having high concentration of repellent may be disposed. In this constitution, the repellent effect is further enhanced.

FIG. 7 shows a both-side copper filled printed wiring board in other different embodiment of the invention. FIG. 8(a) and FIG. 8(b) show application patterns of electronic material. In FIG. 7, the electronic material placed on the face surface and the electronic material placed on the back surface have mutually different areas. These electronic materials are cured in mutually different ultraviolet curing processes.

Figure 7A:
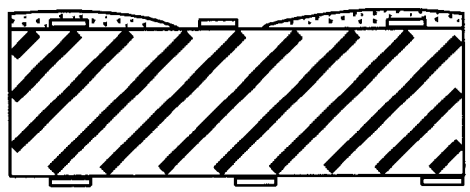
FIG. 7 is a sectional view of essential parts showing a further different embodiment of manufacturing process of printed wiring board of the invention.
Figure 8:
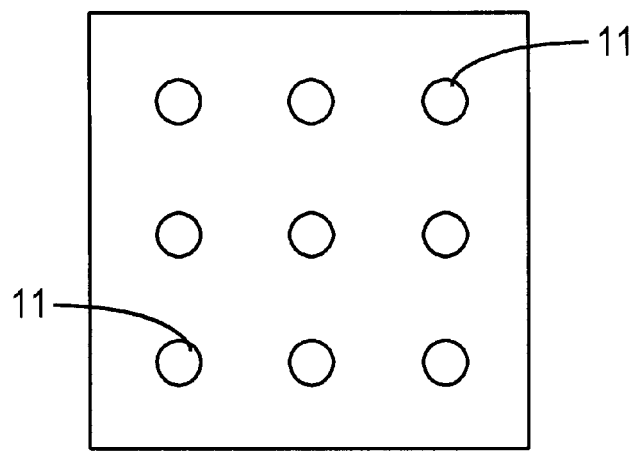
FIG. 8(a) and FIG. 8(b) are explanatory diagrams showing a further different application pattern of electronic material used in the printed wiring board of the invention.
Figure 8:
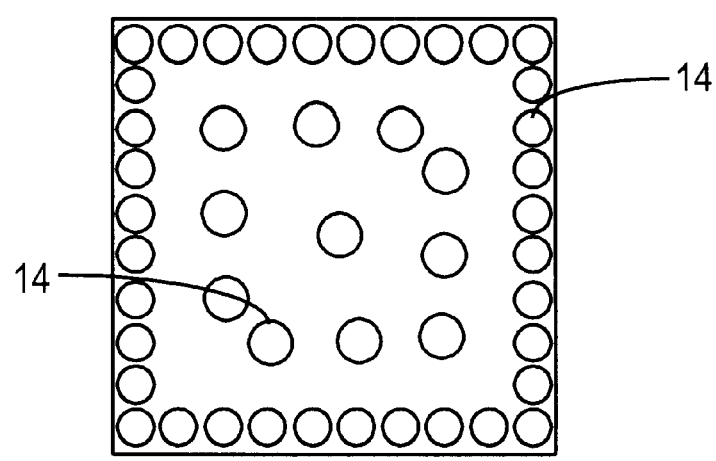

As shown in FIG. 7(a), on a glass epoxy (FR-4) insulating layer (substrate or base material) 1, a conductive layer 2 is formed as a specified copper foil. An ultraviolet curing type solder resist 9 is applied to cover the conductive layer 2 except for the soldering area. This ultraviolet curing type solder resist 9 is cured provisionally in an ultraviolet curing oven at 800 mJ/cm$^2$, by about 60 to about 85% of the ordinary integrated quantity of light of 1000 mJ/cm$^2$.

Figure 7B:
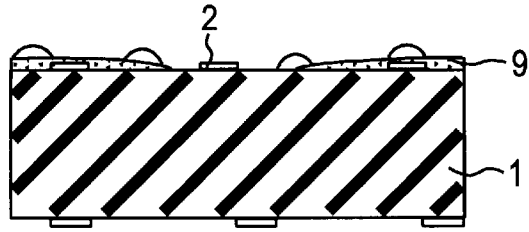

Next, as shown in FIG. 7(b), a fifth electronic material 11 is applied on the ultraviolet curing type solder resist 9 placed on the first surface, in dots of 1 mm in diameter at pitches of 4 mm, in about 30 to about 90% of the application area as shown in FIG. 8(a), and the fifth electronic material 11 is cured provisionally in the ultraviolet curing oven at 1000 mJ/cm$^2$, by about 45 to about 85% of the ordinary curing heat.

Figure 7C:
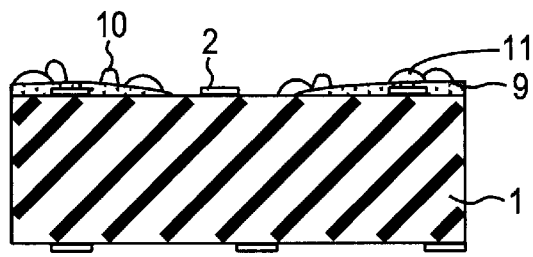

As shown in FIG. 7(c), an ultraviolet curing type parts layout 10 is applied on the ultraviolet curing type solder resist 9 and the fifth electronic material 11 on the first surface, and this ultraviolet curing type parts layout 10 is cured provisionally in the ultraviolet curing oven at 800 mJ/cm$^2$, by about 50 to about 85% of the ordinary integrated quantity of light of 1000 mJ/cm$^2$.

Figure 7D:
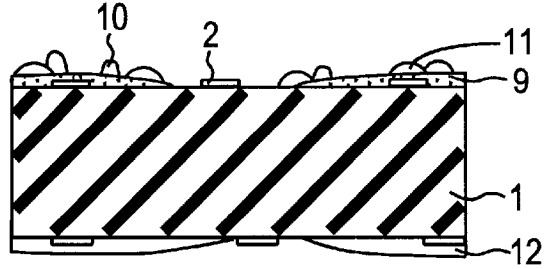

As shown in FIG. 7(d), covering the conductive layer 2 except for the soldering area of the parts mounting side of the second surface, an ultraviolet curing type solder resist 12 is applied, and this ultraviolet curing type solder resist 12 is cured provisionally in the ultraviolet curing oven at 900 mJ/cm$^2$, by about 70 to about 90% of the ordinary integrated quantity of light of 1000 mJ/cm$^2$.

Figure 7E:
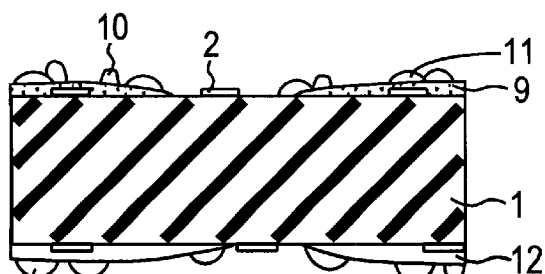

As shown in FIG. 7(e), a sixth electronic material 14 is applied on the ultraviolet curing type solder resist 12 on the second surface in a shape as shown in FIG. 8(b). The shape is dots of 1 mm in diameter at pitches of 1.5 mm around the substrate, and dots of 1 mm in diameter at pitches of 3 mm in the center of the substrate, so that the film density is inclined. The sixth electronic material 14 is cured provisionally in the ultraviolet curing oven in the condition of 1000 mJ/cm$^2$, by about 45 to about 85% of the ordinary curing head of the sixth electronic material 14.

Figure 7F:
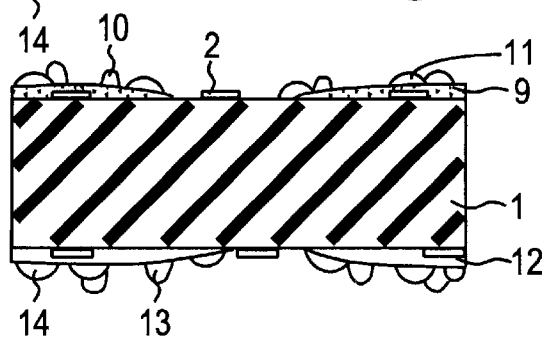

Finally, as shown in FIG. 7(f), an ultraviolet curing type parts layout 13 is applied on the ultraviolet curing type solder resist 12 and the sixth electronic material 14 of ultraviolet curing type on the second surface, and this ultraviolet curing type parts layout 13 is cured fully in the ultraviolet curing oven at 1000 mJ/cm$^2$. Thus, the printed wiring board is fabricated.

In the foregoing embodiments, the term "provisional curing" means an incomplete state of curing. The term "ordinary curing heat" or "ordinary integrated quantity of light" means the heat or integrated quantity of light necessary for complete curing. For provisional curing, the curing condition such as the curing time and integrated quantity of light is controlled, but not limited to this, for example, the degree of curing may be controlled. For example, in the thermosetting material, "provisional curing at 60% of ordinary heat" means "curing up to 60% of the completely cured state." In the ultraviolet curing type material, similarly, "provisional curing at 70% of ordinary integrated quantity of light" means "curing up to 70% of the completed cured state." Therefore, for provisional curing, the degree of curing of the material may be controlled by control of curing temperature, control of quantity of light irradiation, or control of irradiation time.

In FIG. 1, FIG. 3, FIG. 5, and FIG. 7, penetration holes may be formed in the insulating substrates, and the electronic components may be mounted by passing through these penetration holes. For example, in FIG. 1, the main body of the electronic component is placed at the second surface side, and the connection terminal of the electronic component is connected to the conductive layer placed on the first surface through its penetration hole. Or, when the electronic component is not an inserted part (discrete part), but is a surface mounted part, the connection terminal of the electronic component is connected to the conductive layer placed on the first surface, and the main body of the electronic component is placed at its first surface side. Such both constitutions are possible.

In the embodiment, therefore, the side mounting the electronic component is the side mounting the electronic component main body.

In these four types of printed wiring boards of the embodiments, the product yield about the blurring and thickness fluctuation was improved by about 10 to 15% as compared with the printed wiring boards applying and forming the electronic materials on the entire surface in the prior art. There was no defect in the parts mounting process due to warp of printed wiring board.

Using these four types of printed wiring boards manufactured in the embodiments, the insect repellent performance was evaluated by using cockroaches as insects.

As comparative examples, in these four printed wiring boards, the electronic material containing the repellent was formed on the entire surface except for the soldering land on the surface of the printed wiring boards, and printed wiring boards (B) were prepared.

As other comparative examples, in the constitution of these four printed wiring boards, printed wiring boards (C) were prepared without forming the electronic materials.

The cockroach repellent performance was evaluated as follows.

In the center of a vinyl chloride vat of 80×100 cm, a paper shelter (nest) and a container of drinking water are placed. At diagonal positions of four corners of the vat, printed wiring boards of the embodiments selectively forming the electronic material containing the repellent, and uncoated printed wiring boards are placed. German cockroaches are put in the vat.

At this time, in order to confirm the difference in the repellent performance with the conventional printed wiring boards having the electronic material applied and formed on the entire surface, the following two tests (1) and (2) were executed simultaneously and compared.

(1) Testing by placing the printed wiring boards of the embodiments selectively applying and forming the electronic material containing the repellent, and uncoated printed wiring boards (C).

(2) Testing by placing the conventional printed wiring boards (B) the electronic material containing the repellent applied and formed on the entire surface, and uncoated printed wiring boards (C).

As insects, 200 adult German cockroaches of each sex were used. As printed wiring boards of the invention, prior art, uncoated examples, printed wiring boards cut in 10 cm square were used. Cube sugar was placed in the center of each sample of printed wiring board. That is, cube sugar is put in the center of the face side of the printed wiring board. Cockroaches invade into the printed wiring board and eats the cube sugar. After lapse of 48 hours, the weight loss of cube sugar was measured. The weight loss of cube sugar is consumption by cockroaches. That is, the loss by eating by cockroaches was measured. As mentioned above, because cockroaches are attracted by heat, a method of evaluation by heat attraction may be considered. However, in order to obtain a quantitative evaluation, an evaluation method by diet attraction was employed herein.

The weight loss of cube sugar placed on the printed wiring board having an excellent repellent effect is small, whereas the weight loss of cube sugar placed on the printed wiring board not having repellent effect is large.

TABLE 1

Figure 2:
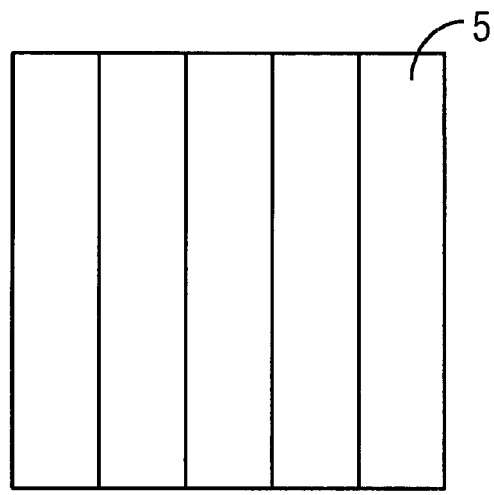
FIG. 2(*a*) and FIG. 2(*b*) are explanatory diagrams showing one application pattern of electronic material used in the printed wiring board of the invention.
Figure 2:
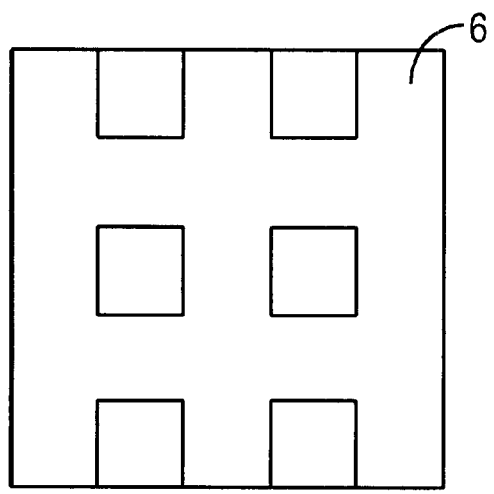
Figure 4:
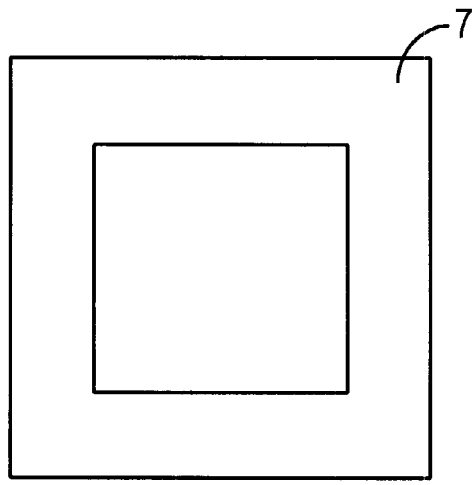
FIG. 4(a) and FIG. 4(b) are explanatory diagrams showing another application pattern of electronic material used in the printed wiring board of the invention.
Figure 4:
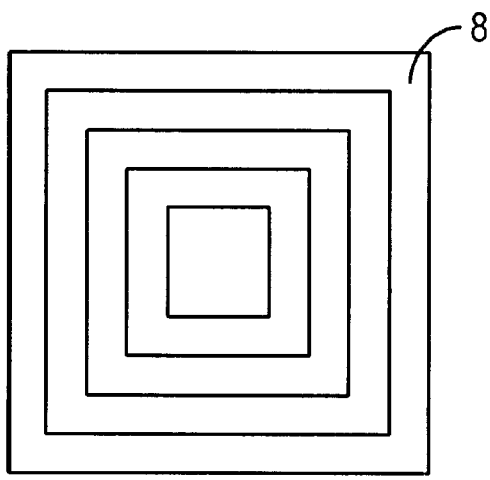

| Type of PWB | Weight loss of cube sugar (mg) | | |
| --- | --- | --- | --- |
| | PWB of invention | PWB of prior art (B) | PWB of prior art (C) |
| PWB in FIG. 1 | 40.5 | 41.2 | 292 |
| PWB in FIG. 2 | 43.7 | 45.3 | 311 |
| PWB in FIG. 3 | 41.9 | 43.8 | 308 |
| PWB in FIG. 4 | 41.1 | 42.4 | 297 |

In Table 1, the weight loss of cube sugar put on the printed wiring boards (PWB)_@ of the invention was 40 mg to 44 mg. By contrast, in the conventional printed wiring boards (B) forming the conventional electronic material containing the repellent, the weight loss of cube sugar was 41 mg to 46 mg. Further, in the conventional printed wiring boards (C) not containing the insect repellent, the weight loss of cube sugar was 290 mg to 310 mg.

On the other hand, in these prepared printed wiring boards, presence or absence of warp was observed. As a result, the printed wiring boards of the invention were completely free from warp. Of the conventional printed wiring boards (B), warp was observed in about 10%. In the conventional printed wiring boards (C), no warp was observed.

Further, in these printed wiring boards, other abnormality in appearance was observed. As a result, all of the printed wiring boards of the invention were free from blurring, thickness fluctuation or other abnormality. In the conventional printed wiring boards (B), thickness fluctuation and blurring were observed in the electronic materials.

As evident from the results of evaluation, the printed wiring boards of the invention selectively forming the electronic material containing the repellent were free from warp, thickness fluctuation, blurring or other abnormality.

Furthermore, the printed wiring boards of the invention selectively forming the electronic material containing the repellent were proved to be equivalent or even superior in the cockroach repellent effect, as compared with the conventional printed wiring boards (B) forming on the entire surface. Further as compared with the conventional printed wiring boards (C) without repellent, the printed wiring boards of the invention present a notably excellent insect repellent effect.

That is, the printed wiring boards of the invention selectively forming the insect repellent layer have same or better insect repellent effects as compared with the conventional printed wiring boards having the insect repellent layer formed on the entire surface.

Further, by preparing printed wiring boards in the method of applying the electronic material containing the repellent in a desired pattern, and curing the applied coat film to the specified hardness, adverse effects of heat when curing the solder resist or parts layout may be suppressed. As a result, loss of the repellent by heat is prevented, and a stable repellent effect is obtained.

By applying the electronic material containing the repellent in a specified pattern selectively, blurring may be prevented at the time of forming the electronic material. Thus, both quality and productivity are enhanced.

Still more, since the consumption of the expensive repellent is saved, the cost is reduced.

Thus, according to the invention, invasion and nesting of insects having sensory nerves such as cockroaches and ants in the printed wiring boards may be suppressed. As a result, the malfunctioning of electronic appliances due to dead bodies and wastes of these insects are prevented. Hence, the reliability of the electronic components is enhanced. Further, thickness fluctuation or blurring of the repellent layer of the electronic material containing the repellent can be prevented. The printed wiring boards of the invention are free from warp or other abnormality in appearance. By using the printed wiring boards of the invention, occurrence of defects in the process of mounting parts are decreased. The productivity is further enhanced.

By the invention, the printed wiring boards having all these effects are obtained.

What is claimed is:

1. A printed wiring board comprising:
   an insulating substrate having a first surface, a second surface, a center, and a peripheral area;
   conductive and insulating layers on at least one of said first and said second surfaces; and
   a repelling material comprising a selective pattern on at least one of said first and second surfaces of said insulating substrate, wherein said repelling material comprises a binder and a concentration of repellent for repelling insects, the repellent being a sensory nerve stimulant for acting on the sensory nerves of insects.

2. The printed wiring board of claim 1,
wherein said selective pattern of said repelling material is a parts layout pattern.

3. The printed wiring board of claim 1, further comprising a parts layout,
wherein said parts layout is on said insulating substrate having said repelling material thereon.

4. The printed wiring board of claim 1,
wherein one of said first and second surfaces has a solder flow part,
said repelling material is on both said first and second surfaces, and
the concentration of repellent in the repelling material on the solder flow part surface is 20–70% greater than the concentration of the repellent in the repelling material on a non-selected surface.

5. The printed wiring board of claim 1, further comprising a plurality of heat generating electronic components mounted on said first and second surfaces,
wherein said repelling material is on both said first and second surfaces, and
the concentration of repellent in the repelling material on the surface with more heat generating electronic components is 20–50% greater than the concentration of repellent in the repelling material on the surface with fewer heat generating electronic components.

6. A printed wiring board of claim 1, further comprising an electronic component placed at least in one of said first and said second surfaces,
wherein said electronic component has a heat generating electronic part, and
said repelling material is formed around said heat generating electronic part.

7. A printed wiring board of claim 1, further comprising an electronic component placed on at least one of said first and said second surfaces,
wherein said electronic component has a heat generating electronic part,
said selective pattern of said repelling material has a peripheral part of said heat generating electronic part, and a remote part from said heat generating electronic part, and
a concentration of the repellent contained in the repelling material formed in said peripheral part is higher than a concentration of the repellent contained in the repelling material formed at said remote part.

8. A printed wiring board of claim 1, further comprising an electronic component placed on at least one of said first and said second surfaces,
wherein said repelling material is disposed in a region excluding immediately beneath said electronic component.

9. The printed wiring board of claim 1,
wherein said selective pattern comprises a mesh.

10. The printed wiring board of claim 1,
wherein said selective pattern comprises stripes.

11. The printed wiring board of claim 1,
wherein said selective pattern comprises dots.

12. A printed wiring board of claim 1,
wherein said selective pattern is a concentric pattern formed in a center of said insulating substrate.

13. A printed wiring board of claim 1,
wherein said selective pattern is a band form formed in a peripheral area of said insulating substrate.

14. A printed wiring board of claim 1,
wherein said selective pattern is formed in a peripheral part of said insulating substrate and inside of said peripheral part, and
a concentration of the repellent contained in the repelling material formed in said peripheral part is higher than a concentration of the repellent contained in the repelling material formed in said inside part.

15. A printed wiring board of claim 1,
wherein said selective pattern is a circular dot shape.

16. A printed wiring board of claim 1,
wherein said selective pattern is at least one shape selected from the group consisting of mesh pattern, stripe pattern, dot pattern, and concentric pattern,
said shape has a plurality of patterns, and
a pitch between patterns of said plurality of patterns is about 1 to about 20 mm.

17. A printed wiring board of claim 1,
wherein said selective pattern comprises at least one shape selected from the group consisting of mesh pattern, stripe pattern, dot pattern, and concentric pattern,
said shape has a plurality of patterns, and
said repelling material forming a pattern disposed outside of the plurality of patterns has a higher repellent concentration than the repelling material forming a pattern disposed inside.

18. A printed wiring board of claim 1, further comprising an electronic component placed on at least one of said first and said second surfaces,
wherein said electronic component has a heat generating electronic part, and
said selective pattern of said repelling material has a concentric pattern around a center of said heat generating part.

19. A printed wiring board of claim 18,
wherein said concentric pattern has a profile having a film density becoming higher as approaching the center.

20. A printed wiring board of claim 18,
wherein said repelling material has said concentric pattern containing the repellent at a higher concentration toward the center thereof.

21. A printed wiring board rising:
an insulating substrate having a first surface, a second surface, a center, and a peripheral area;
conductive and insulting layers on at least one of said first and second surfaces;
a repelling material comprising a selective pattern on at least one of said first and second surfaces of said insulating substrate, wherein said repelling material comprises a binder and a concentration of repellent for repelling insects, and the repellent is a sensory nerve stimulant for acting on the sensory nerves of insects;
an electronic component on said second surface, wherein said repelling material is in the form of a first pattern on said first surface; and
a second pattern on said second surface, said second pattern having a wider area than said first pattern.

22. The printed wiring board of claim 21,
wherein the area of said first pattern is 30–90% of the area of said second pattern.

23. The printed wiring board of claim 21,
wherein the selected pattern of the repelling material comprises a parts layout.

24. The printed wiring board of claim 21, further comprising a parts layout on the insulating substrate.

25. The printed wiring board of claim 21, wherein the selective pattern comprises a mesh.

26. The printed wiring board of claim 21, wherein the selective pattern comprises stripes.

27. A printed wiring board comprising:
an insulating substrate having a first surface, a second surface, a center, and a peripheral area;
conductive and insulting layers on at least one of said first and said second surfaces; and
a repelling material forming selective pattern on at least one of said first and said second surfaces of said insulating substrate, wherein said repelling material comprises a binder and a concentration of repellent for repelling insects and the repellent is a sensory nerve stimulant for acting on the sensory nerves of insects, wherein said repelling material further comprises a first electronic repelling material placed on said first surface, and a second electronic repelling material placed on said second surface, and the repellent concentration in said first electronic material differs from the repellent concentration in said second electronic material.

28. The printed wiring board of claim 27, wherein the selective pattern comprises a parts layout.

29. The printed wiring board of claim 27, further comprising a parts layout on the insulating substrate.

30. The printed wiring board of claim 27, wherein selective pattern comprises a mesh.

31. The printed wiring board of claim 27, wherein the selective pattern comprises stripes.

32. A printed wiring board comprising:
an insulating substrate having a first surface, a second surface, a center, and a peripheral area;
conductive and insulting layers on at least one of said first and second surfaces;
a repelling material comprising a selective pattern on at least one of said first and second surfaces of said insulating substrate,
wherein said repelling material comprises a binder and a concentration of repellent for repelling insects, and the repellent is a sensory nerve stimulant for acting on the sensory nerves of insects, wherein said repelling material is on both said first and second surfaces; and
a soldering land surface selected from one of said first and second surfaces having a soldering land, wherein the repelling electronic material on the soldering land surface has a higher concentration of said repellent than the repelling material placed on a non-selected surface.

33. The printed wiring board of claim 32, wherein the selective pattern comprises a parts layout.

34. The printed wiring board of claim 32, further comprising a parts layout on the insulating substrate.

35. The printed wiring board of claim 32, wherein the selective pattern comprises a mesh.

36. The printed wiring board of claim 32, wherein the selective pattern comprises stripes.

37. A printed wiring board comprising:
an insulating substrate having a first surface, a second surface, a center, and a peripheral area;
conductive and insulting layers on at least one of said first and said second surfaces; and
a repelling material forming a selective pattern on at least one of said first and said second surfaces of said insulating substrate,
wherein said repelling material comprises a binder and a concentration of repellent for repelling insects, and the repellent is a sensory nerve stimulant for acting on the sensory nerves of insects; end
a plurality of heat generating electronic components on said first and second surfaces,
wherein said repelling material is on both said first and said second surfaces, and the repelling material on a surface having more heat generating electronic components has a higher concentration of said repellent than the repelling material on a surface having fewer heat generating components.

38. The printed wiring board of claim 37, wherein the selective pattern comprises a parts layout.

39. The printed wiring board of claim 37, further comprising a parts layout the insulating substrate.

40. The printed wiring board of claim 37, wherein the selective pattern comprises a mesh.

41. A printed wiring board of claim 37, wherein the selective pattern comprises stripes.

* * * * *